United States Patent
Lee et al.

(10) Patent No.: US 7,956,702 B2
(45) Date of Patent: Jun. 7, 2011

(54) BALUN

(75) Inventors: Dong Hwan Lee, Gyunggi-do (KR); Hee Soo Yoon, Gyunggi-do (KR)

(73) Assignee: Samsung Electro-Mechanics Co., Ltd., Suwon (KR)

(*) Notice: Subject to any disclaimer, the term of this patent is extended or adjusted under 35 U.S.C. 154(b) by 193 days.

(21) Appl. No.: 12/262,206

(22) Filed: Oct. 31, 2008

(65) Prior Publication Data

US 2009/0295496 A1    Dec. 3, 2009

(30) Foreign Application Priority Data

Jun. 3, 2008 (KR) .................. 10-2008-0052029

(51) Int. Cl.
*H03H 7/42* (2006.01)
*H01P 5/12* (2006.01)
(52) U.S. Cl. .................................. 333/25; 333/134
(58) Field of Classification Search .......... 333/25, 333/26, 134
See application file for complete search history.

(56) References Cited

U.S. PATENT DOCUMENTS

| | | | |
|---|---|---|---|
| 6,621,370 B1 * | 9/2003 | Dao | 333/25 |
| 6,914,512 B2 | 7/2005 | Park et al. | |
| 6,952,142 B2 * | 10/2005 | Guitton et al. | 333/25 |
| 7,116,185 B2 | 10/2006 | Ohi et al. | |
| 7,330,085 B2 * | 2/2008 | Ezzeddine | 333/26 |
| 2004/0095212 A1 | 5/2004 | Iwasaki et al. | |

FOREIGN PATENT DOCUMENTS

| | | |
|---|---|---|
| JP | 2005166702 A | 6/2005 |
| KR | 1020000059649 A | 10/2000 |
| KR | 20040027039 A | 4/2004 |
| KR | 1020080017951 A | 2/2008 |

* cited by examiner

*Primary Examiner* — Dean O Takaoka
(74) *Attorney, Agent, or Firm* — Lowe, Hauptman, Ham & Berner, LLP

(57) ABSTRACT

A balun having a first balanced terminal, a second balanced terminal and an unbalanced terminal, includes a filter unit and a first transmission line. The filter unit is connected to the first balanced terminal, the second balanced terminal and the unbalanced terminal, and includes a low-pass filter and a high-pass filter. The first transmission line is connected between the filter unit and the first balanced terminal.

9 Claims, 11 Drawing Sheets

BALUN

CROSS-REFERENCE TO RELATED APPLICATIONS

This application claims the priority of Korean Patent Application No. 2008-52029 filed on Jun. 3, 2008, in the Korean Intellectual Property Office, the disclosure of which is incorporated herein by reference.

BACKGROUND OF THE INVENTION

1. Field of the Invention

The present invention relates to a balun, and more particularly, to a balun capable of improving a matching impedance characteristic, a signal pass characteristic and an isolation characteristic between balanced terminals by using a transmission line and a resonant circuit.

2. Description of the Related Art

A balun is a circuit or a device that converts a balanced signal into an unbalanced signal or converts an unbalanced signal into a balanced signal. The balun may be implemented by using a combination of transmission lines or a lumped element.

FIGS. 1A and 1B are a diagram and an equivalent circuit diagram of a related art balun circuit.

Referring to FIG. 1A, the related art balun circuit is implemented by using a transmission line 110 having an electrical length of $\lambda/4$ and a transmission line 120 having an electrical length of $3\lambda/4$.

The balun circuit of FIG. 1A may be represented by an equivalent circuit of FIG. 1B. In the equivalent circuit of FIG. 1B, a first inductor 121 and a second capacitor 122 formed between an input terminal 101 and a first output terminal 102 may operate as a low-pass filter using a center frequency of the balun circuit as a cutoff frequency. A first capacitor 131 and a second inductor 132 formed between the input terminal 101 and a second output terminal 103 may operate as a high-pass filter.

The balun circuit configured as above cannot attain excellence in a reflection loss characteristic of an unbalanced terminal, a signal pass characteristic between the input terminal and the output terminal, and a signal isolation characteristic between two balanced terminals.

SUMMARY OF THE INVENTION

An aspect of the present invention provides a balun capable of improving a matching impedance characteristic, a signal pass characteristic and an isolation characteristic between balanced terminals by using a transmission line and a resonant circuit.

According to an aspect of the present invention, there is provided a balun having a first balanced terminal, a second balanced terminal and an unbalanced terminal, the balun including: a filter unit connected to the first balanced terminal, the second balanced terminal and the unbalanced terminal, the filter unit including a low-pass filter and a high-pass filter; and a first transmission line connected between the filter unit and the first balanced terminal.

The first transmission line may maintain a phase difference of 180 degrees between the first balanced terminal and the second balanced terminal.

The filter unit may include: a first inductor connected in series between the first transmission line and the balanced terminal; a first capacitor connected in series between the unbalanced terminal and the second balanced terminal; a second inductor having one end connected between the first capacitor and the unbalanced terminal, and the other end connected to a ground terminal; and a second capacitor having one end connected between the first inductor and the unbalanced terminal and the other end connected to a ground terminal.

The filter unit may include: a first inductor connected in series between the first transmission line and the unbalanced terminal; a first capacitor connected in series between the unbalanced terminal and the second balanced terminal; and a second transmission line having one end connected between the first inductor and the first capacitor, and the other end connected to a ground terminal.

The second transmission line may have an electrical length of 90 degrees.

The balun may further include a second inductor connected in series to the second transmission line.

The balun may further include a second capacitor connected in series to the second transmission line.

The balun may further include a second capacitor connected in parallel to the second transmission line.

The filter unit may include: a first inductor connected in series between the first transmission line and the unbalanced terminal; a first capacitor connected in series between the unbalanced terminal and the second balanced terminal; and a second transmission line having one end connected between the first inductor and the first capacitor, and the other end which is open.

The second transmission line may have an electrical length of 180 degrees.

The balun may further include a second capacitor having one end connected between the first inductor and the first capacitor, and the other end connected to a ground terminal.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 2:
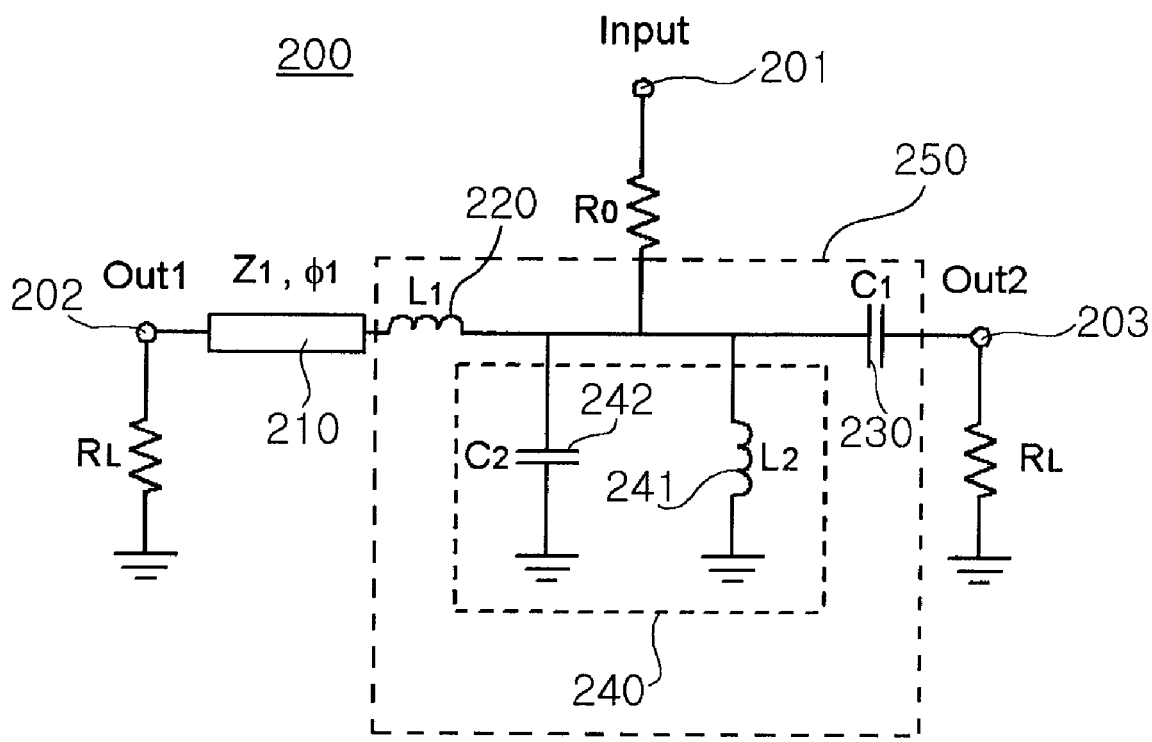
FIG. 2 is a diagram of a balun according to an exemplary embodiment of the present invention.

FIG. 2 is a diagram of a balun according to an exemplary embodiment of the present invention.

Referring to FIG. 2, the balun 200 according to this embodiment of the present invention may include a first transmission line 210 and a filter unit 250.

The balun 200 may include one unbalanced terminal 201 and two balanced terminals 202 and 203 (hereinafter, also referred to as first and second balanced terminals 202 and 203). According to this embodiment, the unbalanced terminal may be formed as an input terminal Input, the balanced terminals may be formed as output terminals Out1 and Out2.

The first transmission line 210 may have one end connected to the first balanced terminal 202 and the other end connected to the filter unit 250.

The filter unit 250 may include a first inductor 220, a first capacitor 230, a second inductor 241, and a second capacitor 242.

The first inductor 220 may have one end connected to the first transmission line 210 and the other end connected to the unbalanced terminal 201. The second capacitor 242 may have one end connected between the first inductor 220 and the unbalanced terminal 201, and the other end connected to a ground terminal.

The first capacitor 230 may be connected in series between the unbalanced terminal 201 and the second balanced terminal 203. The second inductor 241 may have one end connected between the first capacitor 230 and the unbalanced terminal 201, and the other end connected to a ground terminal.

According to this embodiment, the first inductor 220 and the second capacitor 242 may form a low-pass filter. The first capacitor 230 and the second inductor 241 may form a high-pass filter.

The first transmission line 210 may be formed to maintain a phase difference of 180 degrees between the first and second balanced terminal 202 and 203. The first transmission line 210 may be expressed using a characteristic impedance $Z_1$ and an electrical length $\Phi 1$. The characteristic impedance and the electrical length of the first transmission line 210 may be varied freely according to characteristics of a circuit.

A resistor $R_0$ connected to the input terminal 201 corresponds to a characteristic impedance of the input terminal 201 through which an unbalanced signal is input. Each of resistors $R_L$ respectively connected to the output terminals 202 and 203 corresponds to a load impedance of a corresponding one of the output terminals 202 and 203 through which a balanced signal is output. The input terminal and the output terminals may be changed with each other according to a direction in which a signal is input.

Figure 3:
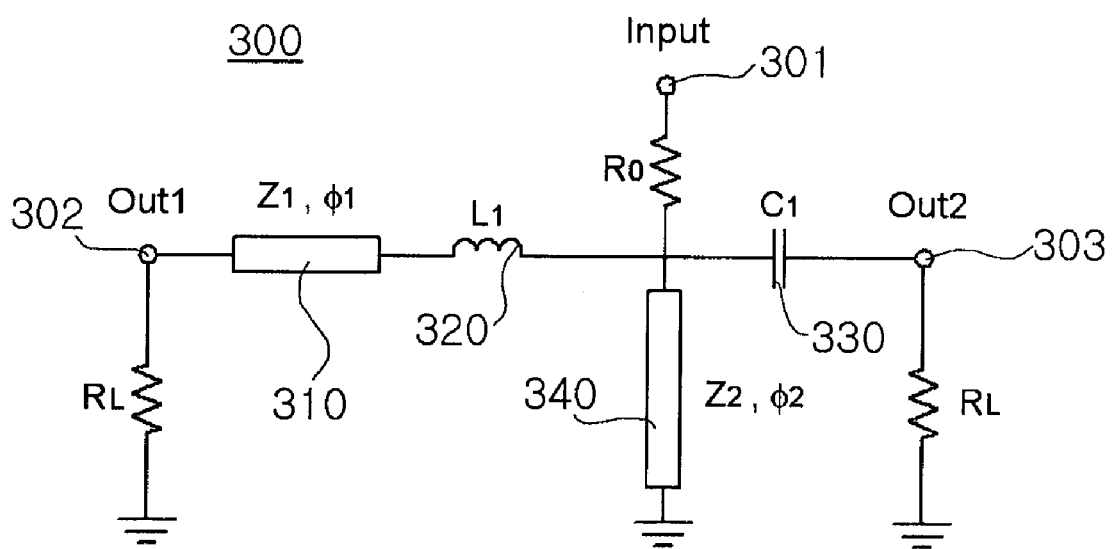
FIG. 3 is a diagram of a balun according to another exemplary embodiment of the present invention.

FIG. 3 is a diagram of a balun according to another exemplary embodiment of the present invention.

Referring to FIG. 3, the balun 300 according to this embodiment may include a first transmission line 310, a first inductor 320, a first capacitor 330, and a second transmission line 240.

The balun 300 may include one unbalanced terminal 301 and two balanced terminals 302 and 303 (hereinafter, also referred to as first and second balanced terminals 302 and 303). According to this embodiment, the unbalanced terminal 301 may be formed as an input terminal Input, and the balanced terminals 302 and 303 may be formed as output terminals Out1 and Out2.

The first transmission line 310 may have one end connected to the first balanced terminal 302 and the other end connected to one end of the first inductor 320. The first inductor 320 may have the other end connected to the unbalanced terminal 301.

The first capacitor 330 may be connected between the unbalanced terminal 301 and the second balanced terminal 303. One end of the second transmission line 340 may be connected between the first inductor 320 and the first capacitor 330.

A resistor $R_0$ connected to the input terminal 301 corresponds to a characteristic impedance of the input terminal 301 through which an unbalanced signal is input. Each of resistors $R_L$ respectively connected to the output terminals 302 and 303 corresponds to a load impedance of a corresponding one of the output terminals 302 and 303 through which a balanced signal is output. The input terminal and the output terminals may be changed with each other according to a direction in which a signal is input.

The first transmission line 310 may be formed to maintain a phase difference of 180 degrees between the first and second balanced terminals 302 and 303. The first transmission line 310 may be expressed using a characteristic impedance $Z_1$ and an electrical length $\Phi 1$. The characteristic impedance and the electrical length of the first transmission line 310 may be varied freely according to characteristics of a circuit.

According to this embodiment, the second transmission line 340 may have one end connected to a ground terminal, and may be expressed using a predetermined characteristic impedance $Z_2$ and an electrical length $\Phi 2$. The electrical length of the second transmission line 340 may be $\lambda/4$ at an operating frequency.

Figure 4:
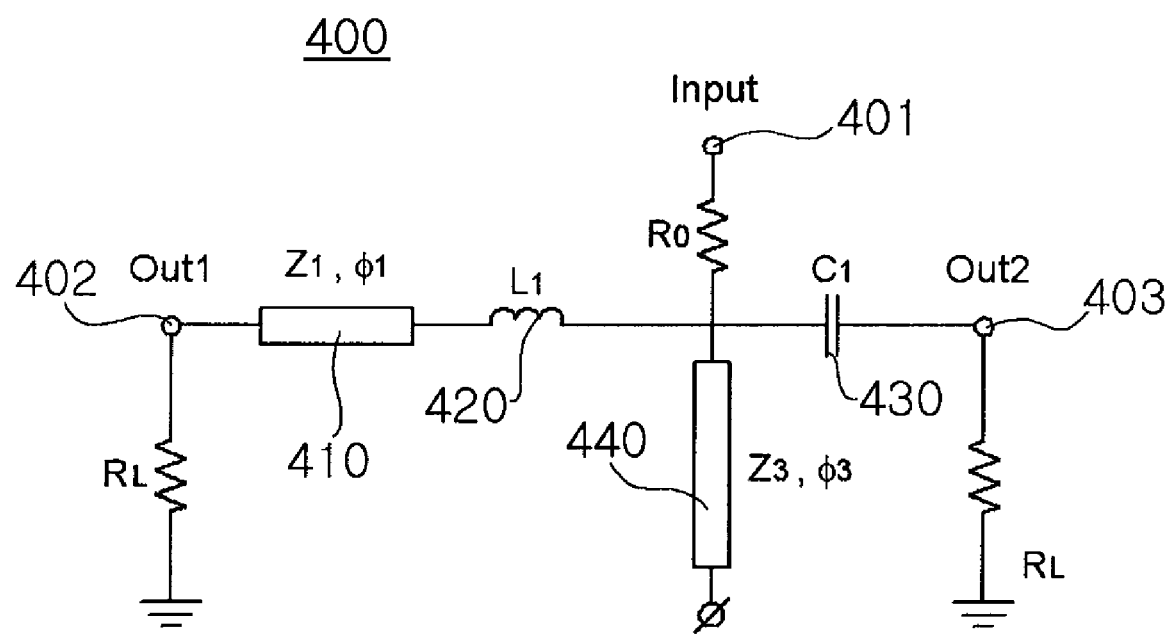
FIG. 4 is a diagram of a balun according to still another exemplary embodiment of the present invention.

FIG. 4 is a diagram of a balun according to still another exemplary embodiment of the present invention.

Referring to FIG. 4, the balun 400 according to this embodiment may include a first transmission line 410, a first inductor 420, a first capacitor 430, and a second transmission line 440.

The balun 400 may include one unbalanced terminal 401 and two balanced terminals 402 and 403 (hereinafter, also referred to as first and second balanced terminals 402 and 403). According to this embodiment, the unbalanced terminal may be formed as an input terminal Input, and the balanced terminals may be formed as output terminals Out1 and Out2.

The first transmission line 410 may have one end connected to the first balanced terminal 402, and the other end connected to one end of the first inductor 420. The other end of the first inductor 420 may be connected to the unbalanced terminal 401.

The first capacitor 430 may be connected between the unbalanced terminal 401 and the second balanced terminal 403. One end of the second transmission line 440 may be connected between the first inductor 420 and the first capacitor 430.

A resistor $R_0$ connected to the input terminal 401 corresponds to a characteristic impedance of the input terminal 401 through which an unbalanced signal is input. Each of resistors $R_L$ respectively connected to the output terminals 402 and 403 corresponds to a load impedance of a corresponding one of the output terminal 402 and 403 through which a balanced signal is output. The input terminal and the output terminals may be changed with each other according to a direction in which a signal is input.

The first transmission line 410 may be formed to maintain a phase difference of 180 degrees between the first and second balanced terminals 402 and 403. The first transmission line 410 may be expressed using a characteristic impedance $Z_1$ and an electrical length $\Phi 1$. The characteristic impedance and the electrical length of the first transmission line 410 may be varied freely according to characteristics of a circuit.

According to this embodiment, the second transmission line 440 may have one open end, and may be expressed using a predetermined characteristic impedance $Z_3$ and an electrical length $\Phi 3$. The electrical length of the second transmission line 440 may be $\lambda/2$ at an operating frequency.

FIGS. 5A through 5D are graphs showing characteristics of the baluns of FIGS. 1 through 4, respectively.

The graphs of FIGS. 5A through 5D show results of measuring characteristics of the corresponding baluns under conditions where a center frequency is 2.5 GHz, a bandwidth is 100 MHz, an input impedance $R_O$ is 50 Ω, an output impedance $R_L$ is 50 Ω, the first inductor $L_1$ and second inductor $L_2$ each have the inductance of 3.183 nH, and the first capacitor $C_1$ and second capacitor $C_2$ each have the capacitance of 1.273 pF. Also, a first transmission line has a characteristic impedance of 50 Ω and an electrical length of 90 degrees at an operating frequency.

In FIGS. 5A to 5D, a first curve ① represents an input terminal impedance matching characteristic (S11), and a second curve ② represents a pass characteristic (S21) of a signal passing from an input terminal to a first output terminal. A third curve ③ represents a pass characteristic (S31) of a signal passing from an input terminal to a second output terminal, and a fourth curve ④ represents an isolation characteristic (S32) between two output terminals.

Figure 1A:
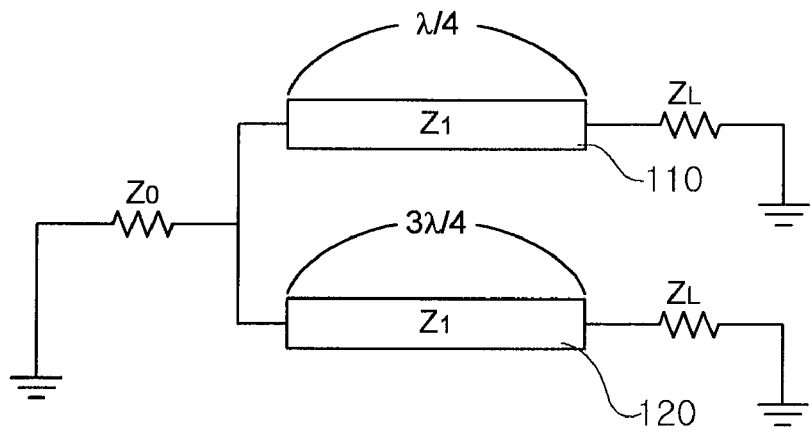
FIGS. 1A and 1B are a diagram and an equivalent circuit diagram, respectively, of a related art balun.
Figure 1B:
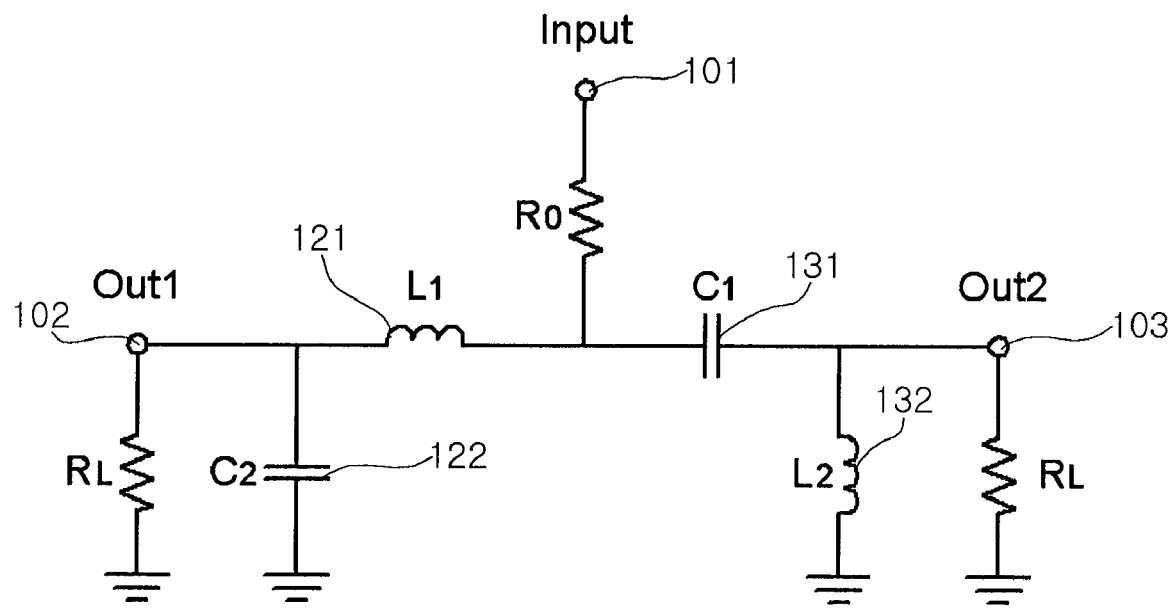
Figure 5A:
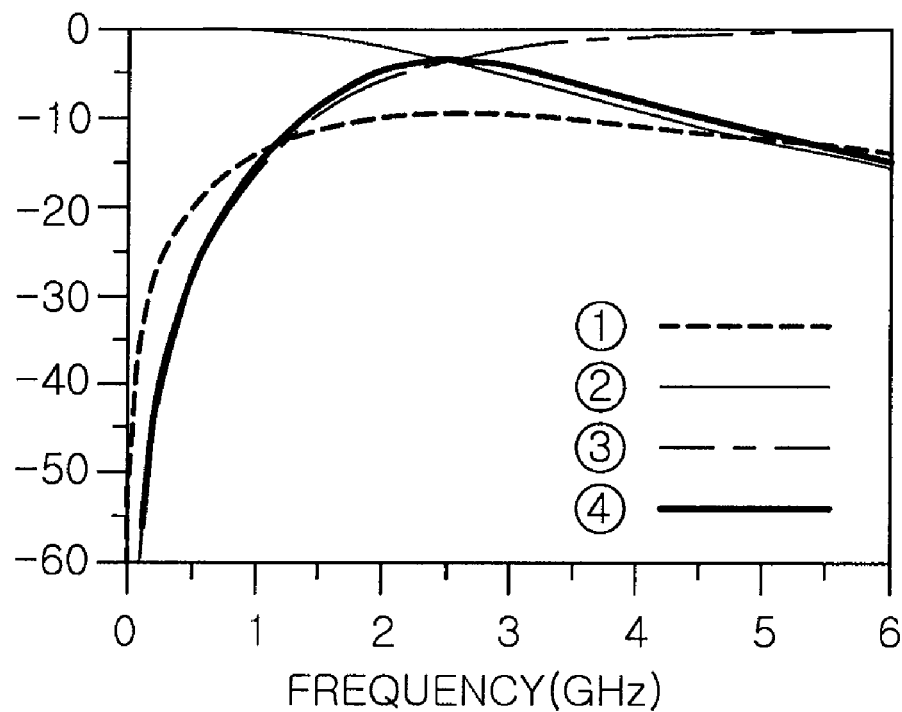
FIGS. 5A through 5D are graphs showing characteristics of the baluns of FIGS. 1 through 4, respectively.
Figure 5B:
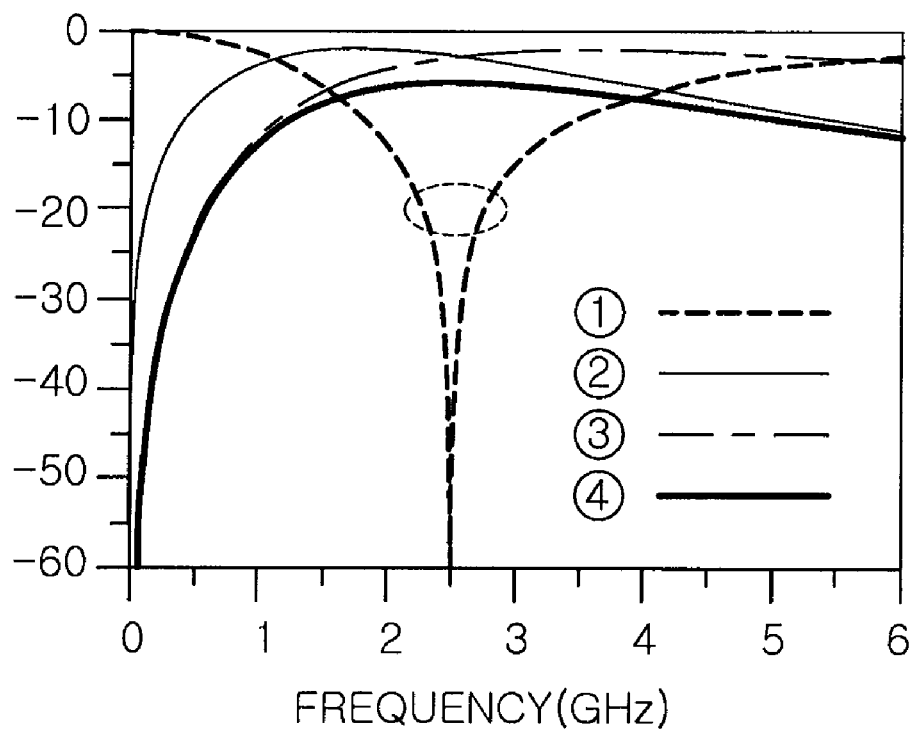

FIG. 5A showing characteristics of the related art balun of FIG. 1 will now be compared with FIG. 5B showing characteristics of the balun according to the embodiment of FIG. 2.

When comparing the input terminal impedance matching characteristics ①, i.e., the input reflection loss between FIGS. 5A and 5B, it can be seen that according to the embodiment of FIG. 2, the balun has a reflection loss reduced below −20 dB at a 2.5 GHz band, i.e., at an operating frequency, unlike the related art balun, and thus the impedance matching characteristic is significantly improved.

When comparing respective signal pass characteristics ② and ③ at a first output terminal and a second output terminal between FIGS. 5A and 5B, the balun of FIG. 2 has an insertion low of about −3.01 dB, whereas the related art balun has an insertion loss of about −3.52 dB at 2.5 GHz. Accordingly, it can be seen that according to the embodiment of FIG. 2, the balun has improved pass characteristics because of the insertion loss which is smaller than that of the related art balun.

When comparing the isolation characteristic ④ between the two output terminals between FIGS. 5A and 5B, the balun according to the embodiment of FIG. 2 has the isolation characteristic of about −6.02 dB, whereas the related art balun has the isolation characteristic of about −3.52 dB. Accordingly, it can be seen that according to the embodiment of FIG. 2, the balun has improved isolation characteristics between the two output terminals as compared to the related art balun.

Figure 5C:
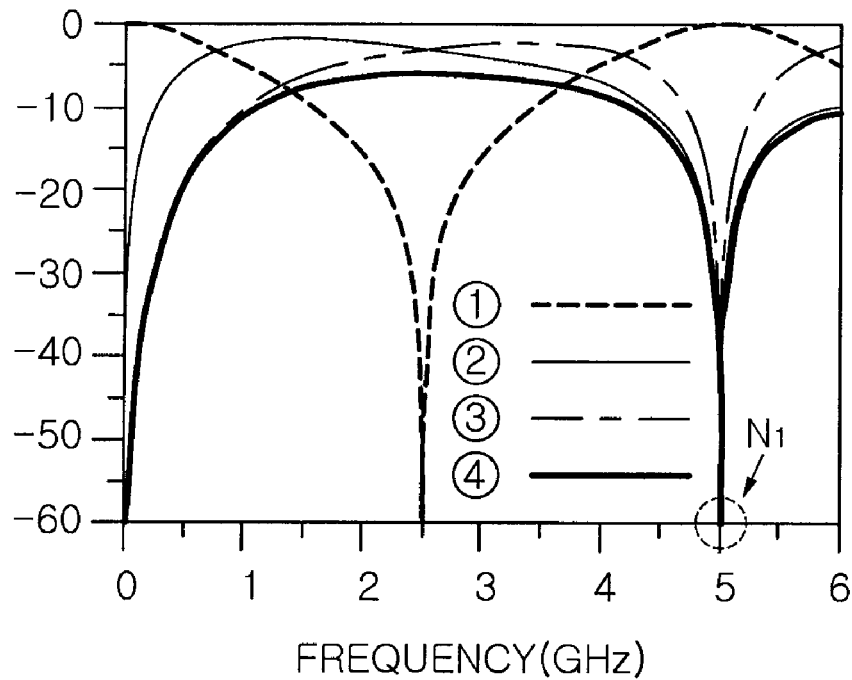

The graph of FIG. 5C shows characteristics of the balun according to the embodiment of FIG. 3. The balun of FIG. 3 is implemented by using the second transmission line 340 as a parallel resonant circuit 240 including the inductor 241 and the capacitor 242 of the embodiment of FIG. 2. The second transmission line 340 has a characteristic impedance of 50 Ω and an electrical length of 90 degrees at an operating frequency.

When comparing FIG. 5B with FIG. 5C, at the 2.5 GHz band, i.e., at the operating frequency, the balun of FIG. 2 and the balun of FIG. 3 may be similar in terms of the input impedance matching characteristic ①, the signal pass characteristics ② and ③, and the isolation characteristic ④.

The difference therebetween is that in the balun of the embodiment 3, an attenuation pole $N_1$ appears at about a 5 GHz band which is two times higher than the 2.5 GHz band, the operating frequency. Thus, according to this embodiment, the balun can achieve good operational characteristics at the 2.5 GHz band, i.e., the operating frequency, and good cutoff characteristics in a frequency band excluding the operating frequency.

Figure 5D:
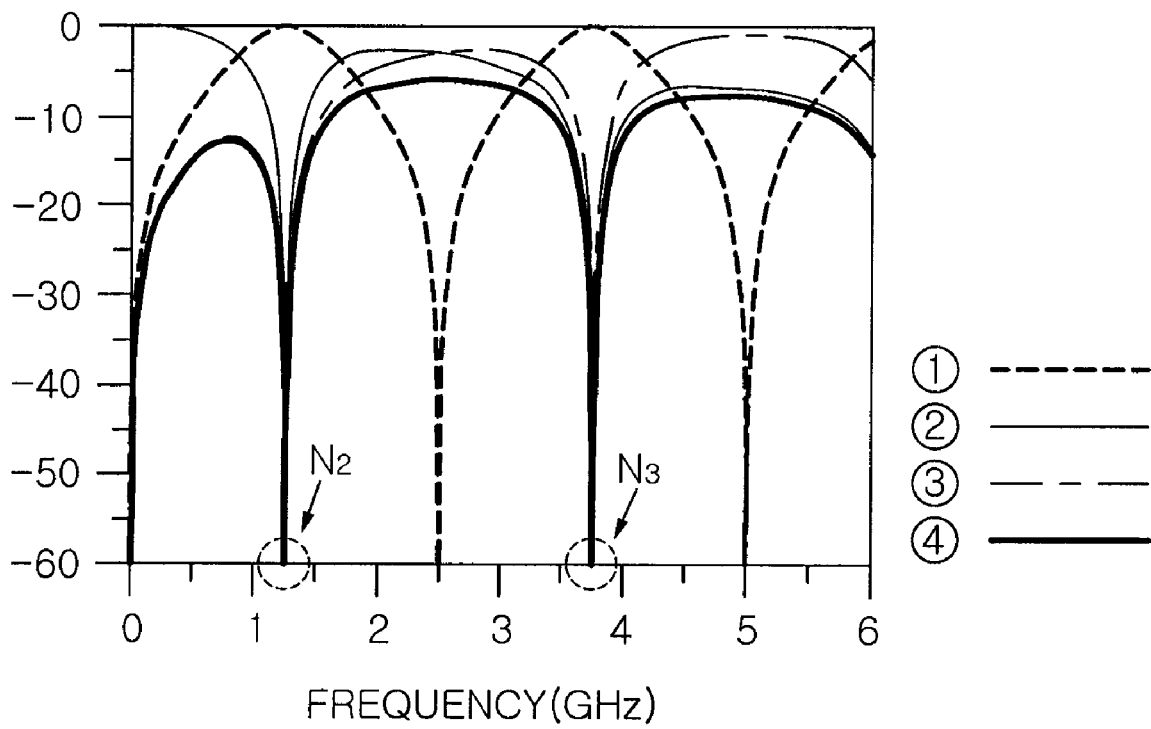

The graph of FIG. 5D shows characteristics of the balun according to the embodiment of FIG. 4. The balun of FIG. 4 is implemented by using a second transmission line 440 having one open end as the resonant circuit 240 including the inductor 241 and the capacitor 242 in the balun of the embodiment of FIG. 2. The second transmission line 440 has a characteristic impedance of 50 Ω and an electrical length of 180 degrees.

When comparing FIG. 5C with FIG. 5D, it can be seen that according to this embodiment, two attenuation poles $N_2$ and $N_3$ are formed at about 1.25 GHz and about 3.75 GHz, respectively. When the two attenuation poles are formed with the passband therebetween, a characteristic of cutting off a frequency of an undesired band can be improved.

Figure 6A:
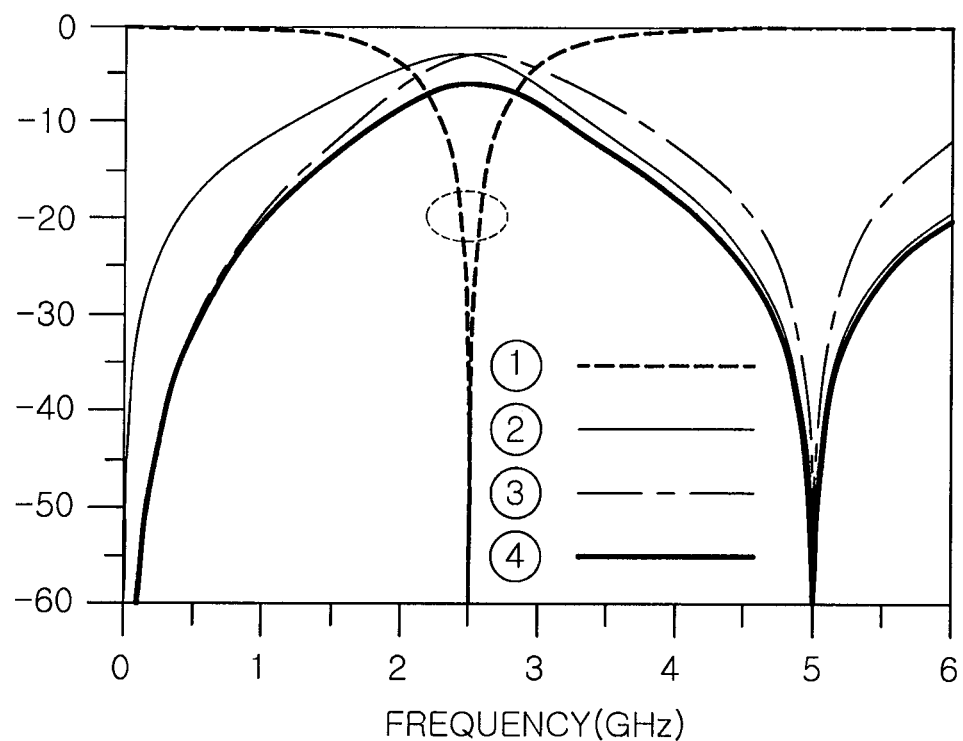
FIGS. 6A and 6B are graphs showing characteristic changes according to the impedance of a second transmission line of the balun of FIG. 3.
Figure 6B:
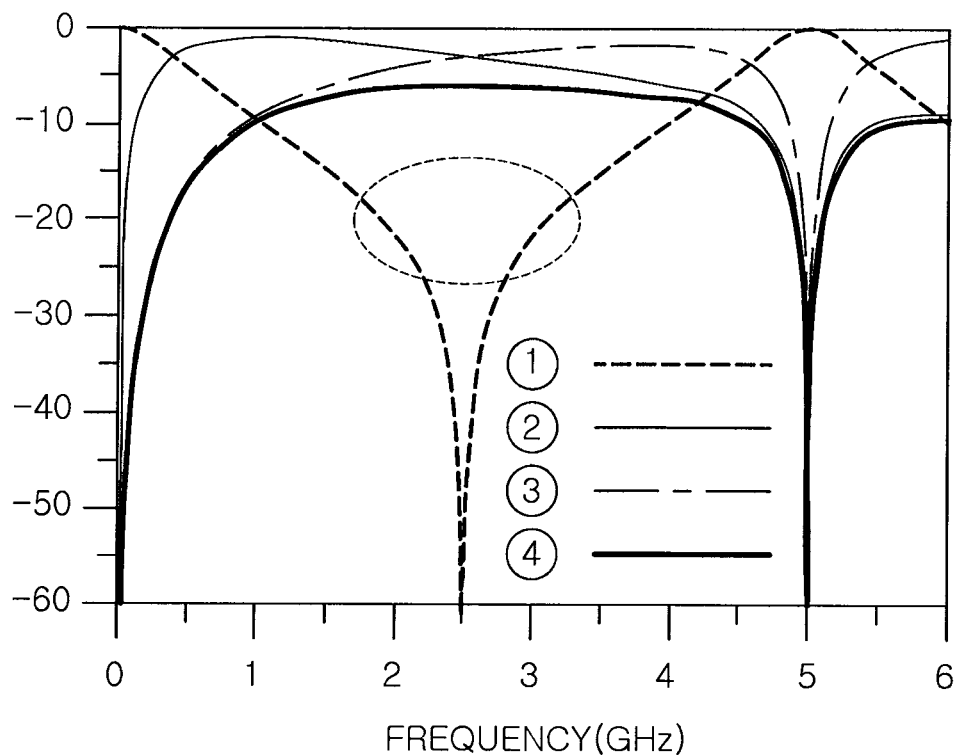

FIGS. 6A and 6B are graphs showing characteristics involved with impedance changes of the second transmission line 340 according to the embodiment of FIG. 3.

FIG. 6A shows results of a simulation performed under the condition where the characteristic impedance of the second transmission line 340 is 10 Ω. FIG. 6B shows results of a simulation performed under the condition where the characteristic impedance of the second transmission line 340 is 100 Ω.

When comparing FIG. 6A with FIG. 6B, it can be seen that when the characteristic impedance of the second transmission line 340 is low, an input matching characteristic ① is narrowbanded, and thus attenuation characteristics ② and ③ in a stop band are significantly improved. In contrast, when the characteristic impedance of the second transmission line 340 is high, the input matching characteristic ① is broad-banded, and the attenuation characteristics ② and ③ in a stop band are degraded. Thus, according to this embodiment, the input matching characteristic, the attenuation characteristic in the stop band and the like can be controlled by controlling the characteristic impedance of the second transmission line 340.

FIGS. 7A and 7B through 10A and 10B are diagrams and characteristic graphs of baluns each having a structure obtained by connecting an additional inductor or capacitor to the balun of FIG. 3, respectively.

Figure 7A:
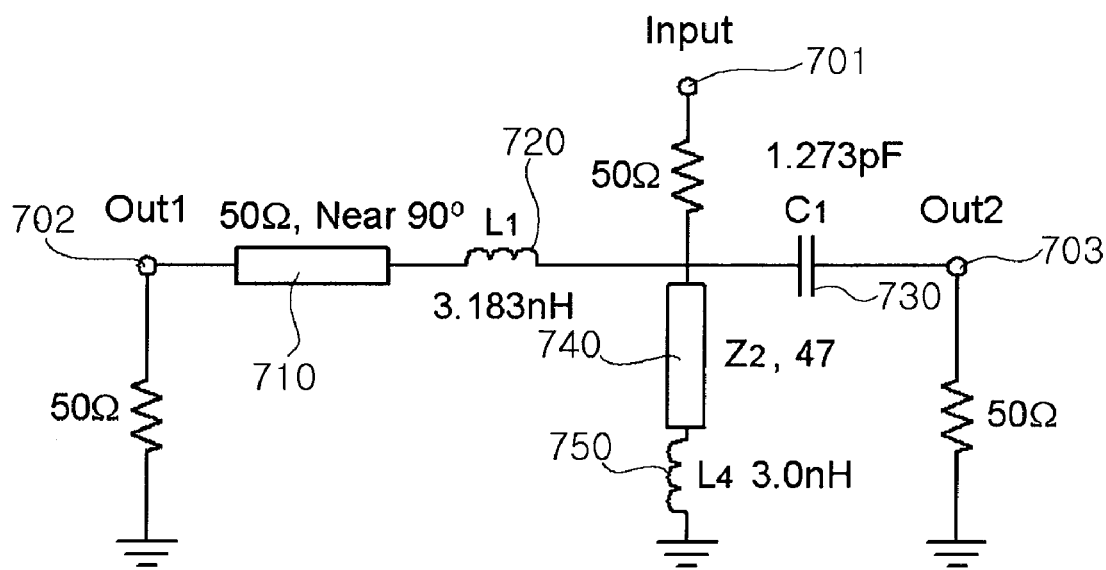
FIGS. 7A and 7B are a diagram and a characteristic graph, respectively, of a balun according to an additional exemplary embodiment of the present invention.
Figure 7B:
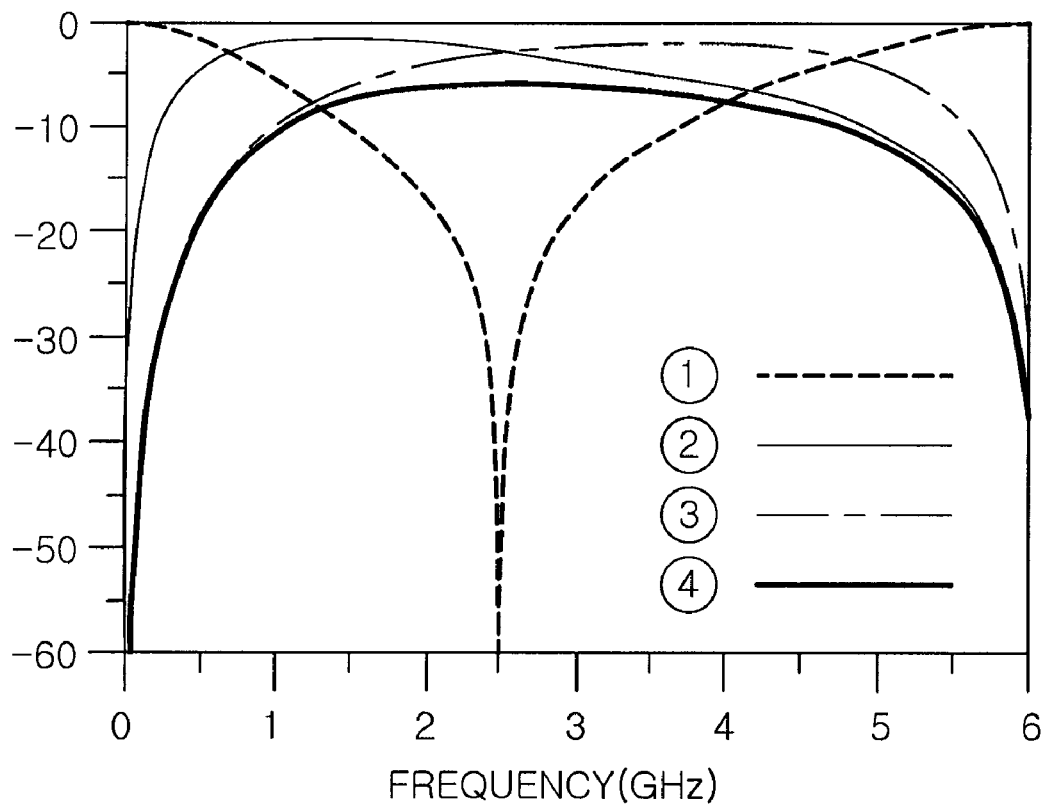

FIGS. 7A and 7B are a diagram and a characteristic graph, respectively, of a balun according to an additional exemplary embodiment of the present invention.

Referring to FIG. 7A, the balun according to this embodiment may have a configuration in which a second inductor 705 is added to the configuration of the balun of the embodiment of FIG. 3. The second inductor 705 may be connected in series between a second transmission line 740 and a ground terminal.

According to this embodiment, an electrical length of the second transmission line 740 may be shortened to about 47 degrees when a first transmission line 710 has a characteristic impedance of 50 Ω and an electrical length of 90 degrees, a first inductor 720 has the inductance of bout 3.183 nH, a first capacitor 730 has the capacitance of 1.273 pF, and the second inductor 750 has the inductance of about 3 nH. Thus, a length of the second transmission line 740 can be shortened by controlling the inductance of the additional second inductor 750. Since a physical length of the second transmission line serving as a resonator is reduced, an attenuation pole may be moved above a frequency of 5 GHz as shown in FIG. 7B.

Figure 8A:
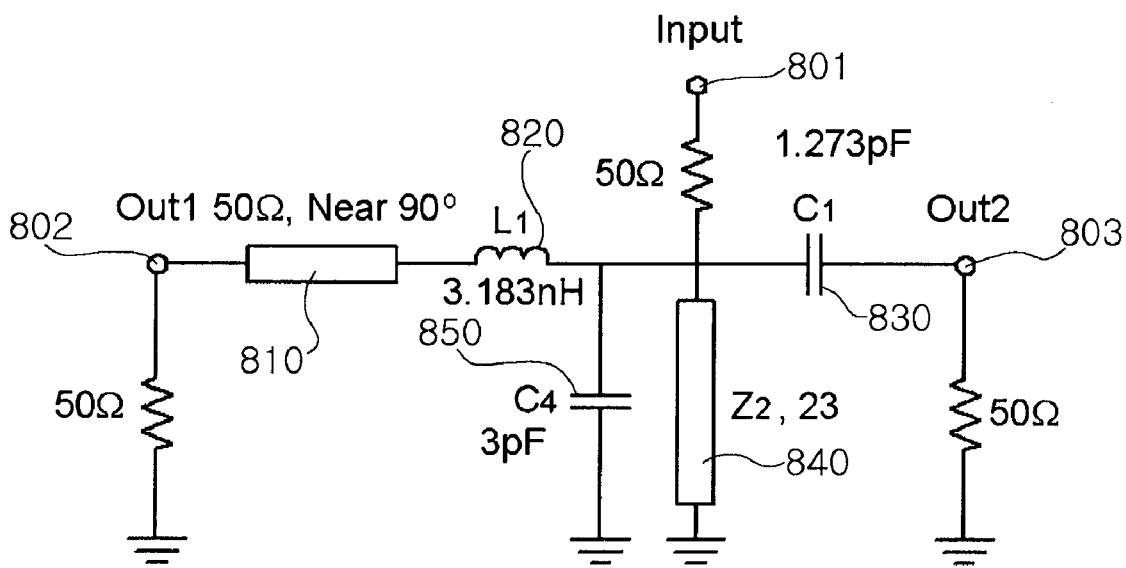
FIGS. 8A and 8B are a diagram and a characteristic graph, respectively, of a balun according to an additional exemplary embodiment of the present invention.
Figure 8B:
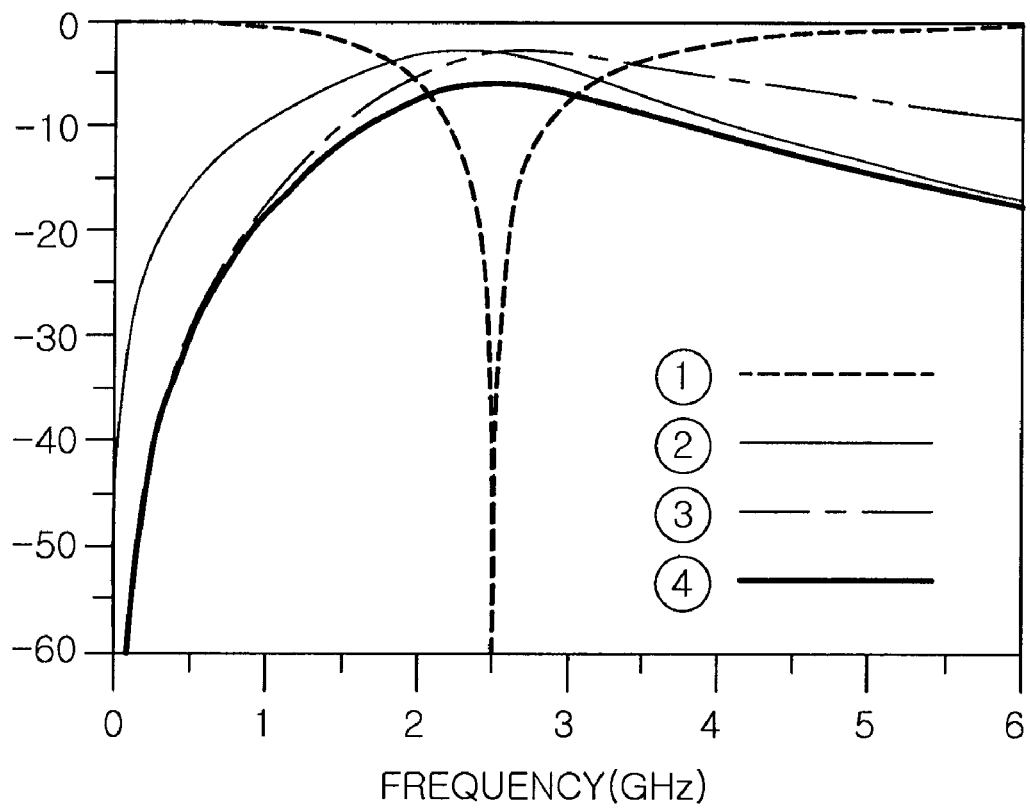

FIGS. 8A and 8B are a diagram and a characteristic graph, respectively, of a balun according to an additional exemplary embodiment of the present invention.

Referring to FIG. 8A, according to this embodiment, the balun may have a configuration in which a second capacitor 850 is added to the configuration of the balun of the embodiment of FIG. 3. The second capacitor 850 may be connected in parallel to a second transmission line 840.

According to this embodiment, an electrical length of the second transmission line 840 may be shortened to 23 degrees when a first transmission line 810 has a characteristic impedance of 50 Ω and an electrical length of 90 degrees, a first inductor 820 has the impedance of about 3.183 nH, a first capacitor 830 has the capacitance of 1.273 pF, and the second capacitor 850 has the capacitance of 3 pF. Accordingly, a length of the second transmission line 840 can be reduced by controlling a capacitance value of the additional second capacitor 850. Since a physical length of a resonator is shorted, an attenuation pole may be moved above a frequency of 5 GHz as shown in FIG. 8B.

Figure 9A:
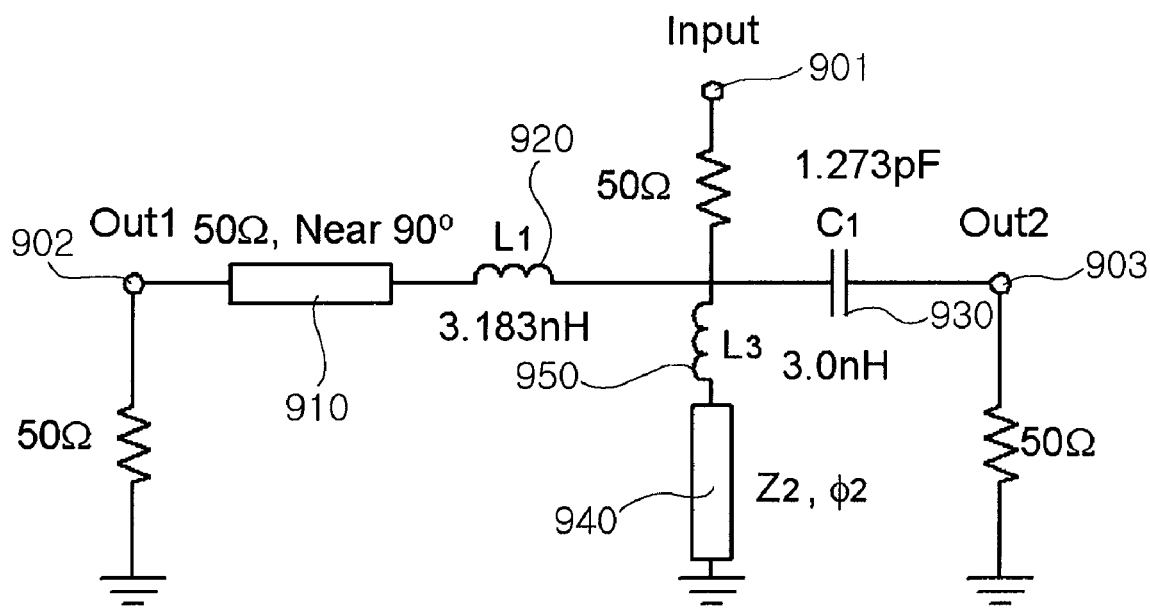
FIGS. 9A and 9B are a diagram and a characteristic graph, respectively, of a balun according to an additional exemplary embodiment of the present invention.
Figure 9B:
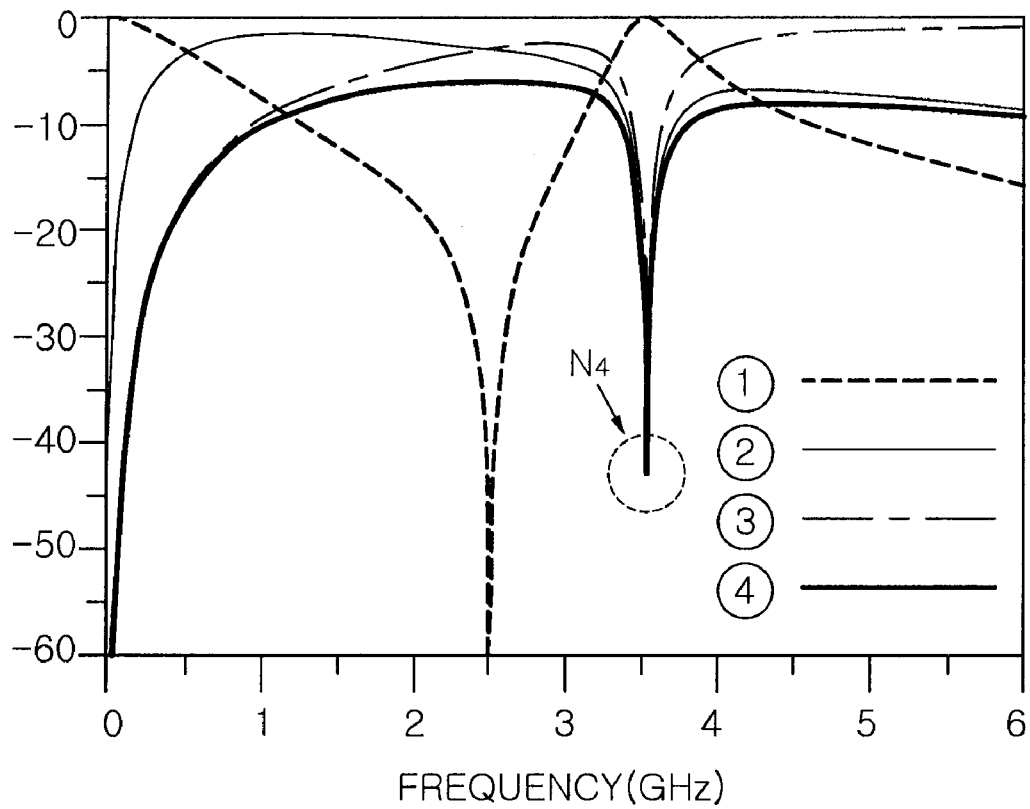

FIGS. 9A and 9B are a diagram and a characteristic graph, respectively, of a balun according to an additional exemplary embodiment of the present invention.

Referring to FIG. 9A, according to this embodiment, the balun may have a configuration in which a second inductor 950 is added to the configuration of the balun of the embodiment of FIG. 3. The second inductor 950 may be connected in series between a second transmission line 940 and an input terminal 901.

When comparing the characteristic graph of FIG. 9B with the graph of FIG. 7B, it can be seen that according to this embodiment, an attenuation pole $N_4$ is moved below 5 GHz. Thus, a signal pass characteristic can be controlled according to a location of the second inductor 950 connected in series to the second transmission line 940.

Figure 10A:
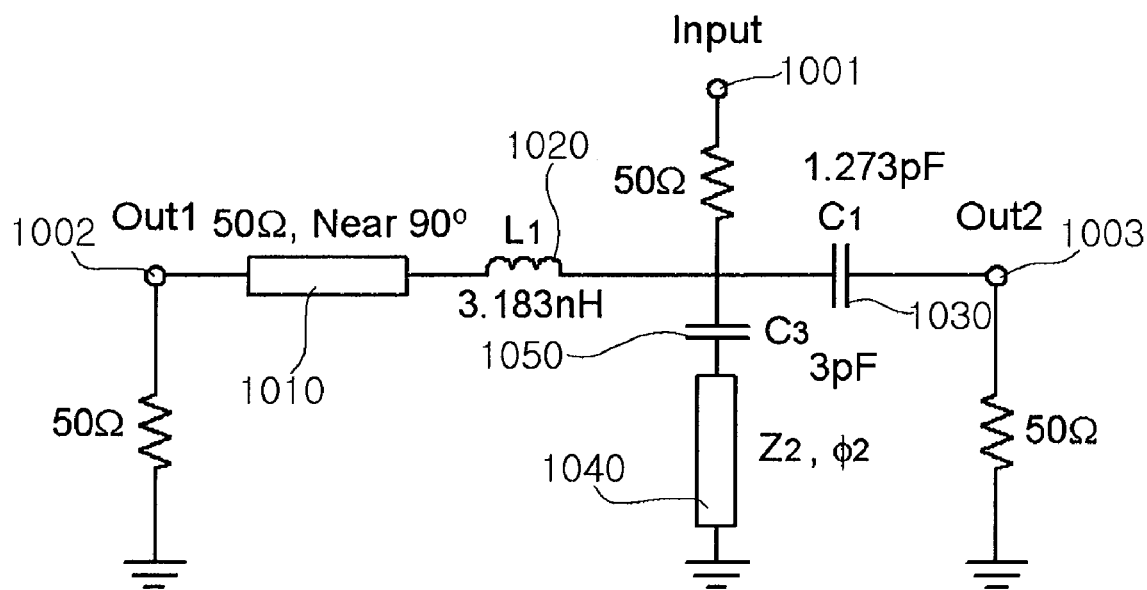
FIGS. 10A and 10B are a diagram and a characteristic graph, respectively, of a balun according to an additional exemplary embodiment of the present invention.
Figure 10B:
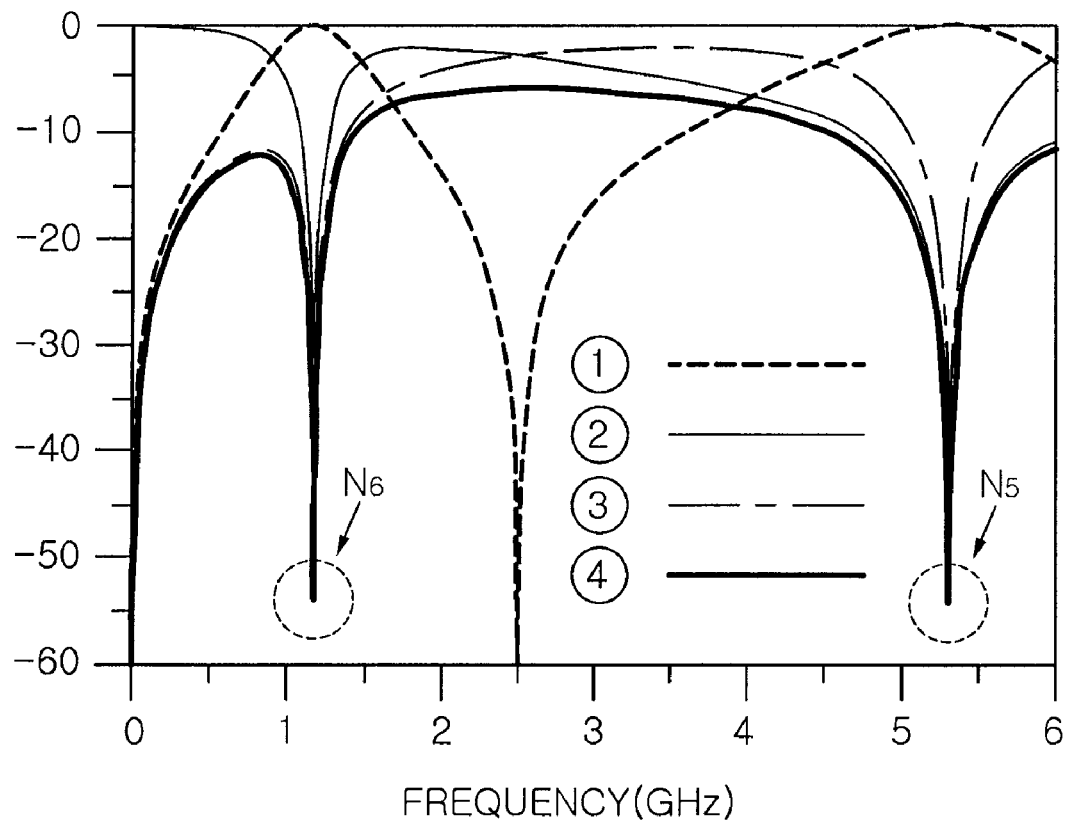

FIGS. 10A and 10b are a diagram and a characteristic graph, respectively, of a balun according to an additional exemplary embodiment of the present invention.

Referring to FIG. 10A, according to this embodiment, the balun may have a configuration in which a second capacitor 1050 is added to the configuration of the balun of the embodiment of FIG. 3. The second capacitor 1050 may be connected in series between a second transmission line 1040 and an input terminal 1001.

When comparing the characteristic graph of FIG. 10B with the graph of FIG. 8B, it can be seen that according to this embodiment, an attenuation pole is moved below 5 GHz. Also, according to this embodiment, two attenuation poles $N_5$ and $N_6$ may be formed with a passband therebetween. Here, frequencies at which the attenuation poles are formed can be controlled by changing the capacitance of the second capacitor 1050 connected in series to the second transmission line 1040.

Figure 11:
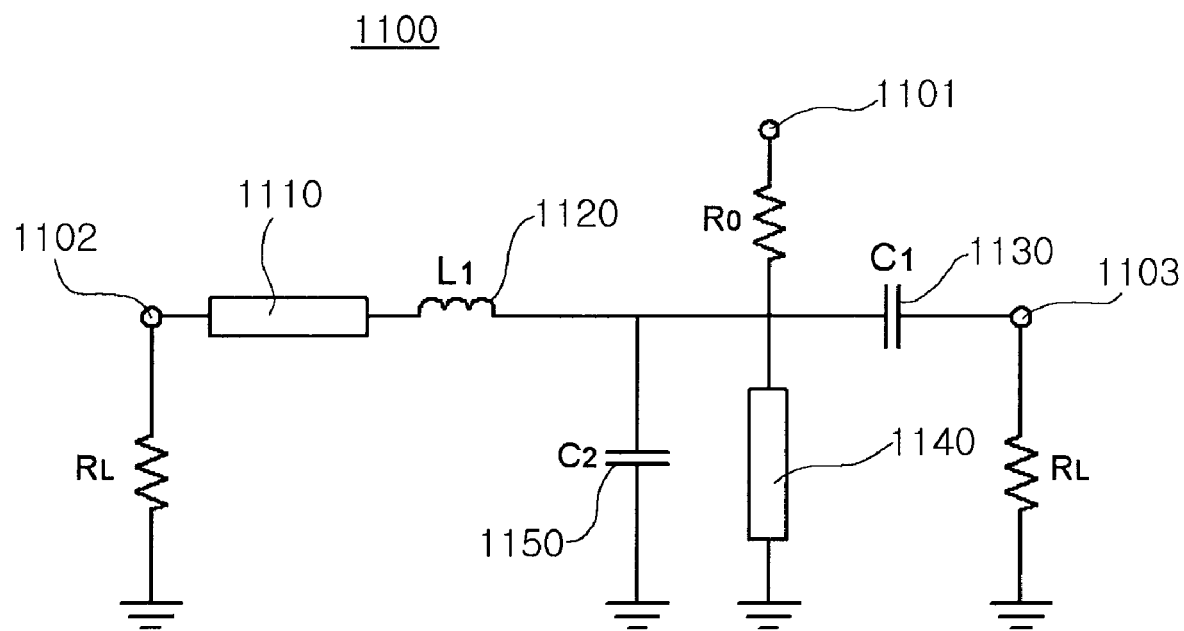
FIG. 11 is a diagram of a balun according to an exemplary embodiment of the present invention.

FIG. 11 is a diagram of a balun according to an additional exemplary embodiment of the present invention.

Referring to FIG. 11, according to this embodiment, a balun 1100 may have a configuration in which a second capacitor 1150 is added to the configuration of the balun of FIG. 4. The second capacitor 1150 may have one end connected between a first inductor and a first capacitor and the other end connected to a ground terminal.

Because capacitive coupling occurs between the second capacitor 1150 and the second transmission line 1140, the length of the second transmission line 1140 can be reduced by controlling the capacitance of the second capacitor 1150.

According to the present invention, a balun can be obtained, which can improve a matching impedance characteristic, a signal pass characteristic, and an isolation characteristic between balanced terminals by using a transmission line and a resonant circuit.

While the present invention has been shown and described in connection with the exemplary embodiments, it will be apparent to those skilled in the art that modifications and variations can be made without departing from the spirit and scope of the invention as defined by the appended claims.

What is claimed is:

1. A balun having a first balanced terminal, a second balanced terminal and an unbalanced terminal, the balun comprising:
   a filter unit coupled to the first balanced terminal and the unbalanced terminal and connected to the second balanced terminal, the filter unit comprising a low-pass filter and a high-pass filter; and
   a first transmission line connected between the filter unit and the first balanced terminal, the first transmission line having no direct connection with the second balanced terminal, and the first transmission line being configured to maintain a phase difference of 180 degrees between the first balanced terminal and the second balanced terminal.

2. A balun having a first balanced terminal, a second balanced terminal and an unbalanced terminal, the balun comprising:
   a filter unit coupled to the first balanced terminal, the second balanced terminal, and the unbalanced terminal, the filter unit comprising a low-pass filter and a high-pass filter; and
   a first transmission line connected between the filter unit and the first balanced terminal, the first transmission line being configured to maintain a phase difference of 180 degrees between the first balanced terminal and the second balanced terminal,
   wherein the filter unit comprises:
   a first inductor connected in series between the first transmission line and the unbalanced terminal;
   a first capacitor connected in series between the unbalanced terminal and the second balanced terminal;
   a second inductor having one end connected between the first capacitor and the unbalanced terminal, and the other end connected to a ground terminal; and
   a second capacitor having one end connected between the first inductor and the unbalanced terminal, and the other end connected to a ground terminal.

3. A balun having a first balanced terminal, a second balanced terminal and an unbalanced terminal, the balun comprising:
   a filter unit coupled to the first balanced terminal, the second balanced terminal, and the unbalanced terminal, the filter unit comprising a low-pass filter and a high-pass filter; and
   a first transmission line connected between the filter unit and the first balanced terminal,
   wherein the filter unit comprises:
   a first inductor connected in series between the first transmission line and the unbalanced terminal;

a first capacitor connected in series between the unbalanced terminal and the second balanced terminal; and a second transmission line having one end connected between the first inductor and the first capacitor, and the other end connected to a ground terminal.

4. The balun of claim 3, wherein the second transmission line has an electrical length of 90 degrees.

5. The balun of claim 3, further comprising a second inductor connected in series to the second transmission line.

6. The balun of claim 3, further comprising a second capacitor connected in series to the second transmission line.

7. The balun of claim 3, further comprising a second capacitor connected in parallel to the second transmission line.

8. A balun having a first balanced terminal, a second balanced terminal and an unbalanced terminal, the balun comprising:
 a filter unit coupled to the first balanced terminal and the unbalanced terminal and connected to the second balanced terminal, the filter unit comprising a low-pass filter and a high-pass filter; and
 a first transmission line connected between the filter unit and the first balanced terminal, the first transmission line having no direct connection with the second balanced terminal, and the first transmission line being configured to maintain a phase difference of 180 degrees between the first balanced terminal and the second balanced terminal, wherein the filter unit comprises:
 a first inductor connected in series between the first transmission line and the unbalanced terminal;
 a first capacitor connected in series between the unbalanced terminal and the second balanced terminal; and
 a second transmission line having one end connected between the first inductor and the first capacitor, and the other end which is open.

9. A balun having a first balanced terminal, a second balanced terminal and an unbalanced terminal, the balun comprising:
 a filter unit coupled to the first balanced terminal, the second balanced terminal, and the unbalanced terminal, the filter unit comprising a low-pass filter and a high-pass filter; and
 a first transmission line connected between the filter unit and the first balanced terminal, wherein the filter unit comprises:
 a first inductor connected in series between the first transmission line and the unbalanced terminal;
 a first capacitor connected in series between the unbalanced terminal and the second balanced terminal;
 a second transmission line having one end connected between the first inductor and the first capacitor, and the other end which is open; and
 a second capacitor having one end connected between the first inductor and the first capacitor, and the other end connected to a ground terminal.

* * * * *